(12) United States Patent
Yu et al.

(10) Patent No.: US 8,574,935 B2
(45) Date of Patent: Nov. 5, 2013

(54) MANUFACTURING METHOD OF SOLID STATE LIGHT EMITTING ELEMENT

(75) Inventors: Chang-Chin Yu, Zhubei (TW); Mong-Ea Lin, Zhubei (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 13/443,374

(22) Filed: Apr. 10, 2012

(65) Prior Publication Data

US 2013/0095591 A1 Apr. 18, 2013

(30) Foreign Application Priority Data

Oct. 18, 2011 (TW) .............................. 100137803 A

(51) Int. Cl.
| | |
|---|---|
| H01L 51/50 | (2006.01) |
| H01L 51/52 | (2006.01) |
| H01L 51/54 | (2006.01) |
| H01L 51/56 | (2006.01) |

(52) U.S. Cl.
USPC ................. 438/26; 438/41; 438/46; 438/106; 438/122; 257/E33.025; 257/E33.028; 257/E33.001

(58) Field of Classification Search
USPC .......... 977/762, 782, 784; 438/167–168, 172, 438/26–27, 31, 33–34, 38–39, 41, 46–47, 438/106, 116, 118–119, 122; 257/E33.025, 257/E33.028, E33.033–E33.034, 623, 257/E25.032, E33.001, E33.005–E33.008
See application file for complete search history.

(56) References Cited

U.S. PATENT DOCUMENTS

| | | | | |
|---|---|---|---|---|
| 7,439,091 B2 * | 10/2008 | Chen et al. | ........................ | 438/32 |
| 7,521,274 B2 * | 4/2009 | Hersee et al. | .................... | 438/41 |
| 7,781,247 B2 | 8/2010 | Tran | | |
| 8,153,455 B2 * | 4/2012 | Kuo et al. | ........................ | 438/22 |
| 8,154,034 B1 * | 4/2012 | Zhang et al. | ..................... | 257/90 |
| 8,242,529 B2 * | 8/2012 | Tsang | ............................. | 257/98 |
| 8,383,493 B2 * | 2/2013 | Wang | .............................. | 438/479 |
| 2003/0006211 A1 * | 1/2003 | Fukunaga et al. | ................. | 216/2 |
| 2006/0091408 A1 * | 5/2006 | Kim et al. | ........................ | 257/94 |
| 2009/0079035 A1 * | 3/2009 | Wang | .............................. | 257/615 |
| 2010/0075452 A1 * | 3/2010 | Lee et al. | ......................... | 438/47 |
| 2010/0276665 A1 * | 11/2010 | Wang | .............................. | 257/15 |
| 2011/0049548 A1 * | 3/2011 | Park et al. | ........................ | 257/98 |
| 2011/0294281 A1 * | 12/2011 | Zang et al. | ..................... | 438/478 |
| 2012/0098014 A1 * | 4/2012 | Muramoto | ..................... | 257/98 |
| 2013/0011656 A1 * | 1/2013 | Zhang et al. | ................. | 428/312.8 |
| 2013/0048941 A1 * | 2/2013 | Yu et al. | .......................... | 257/13 |
| 2013/0069107 A1 * | 3/2013 | Nozaki et al. | ................. | 257/103 |

* cited by examiner

Primary Examiner — Laura Menz
Assistant Examiner — Maliheh Malek
(74) Attorney, Agent, or Firm — McClure, Qualey & Rodack, LLP

(57) ABSTRACT

A manufacturing method of a solid state light emitting element is provided. A plurality of protrusion structures separated to each other are formed on a first substrate. A buffer layer is formed on the protrusion structures and fills the gaps between protrusion structures. An epitaxial growth layer is formed on the buffer layer to form a first semiconductor stacking structure. The first semiconductor stacking structure is inverted to a second substrate, so that the first semiconductor epitaxial layer and the second substrate are connected to form a second semiconductor stacking structure. The buffer layer is etched by a first etchant solution to form a third semiconductor stacking structure. A second etchant solution is used to permeate through the gaps between the protrusion structures, so that the protrusion structures are etched completely. The first substrate is removed from the third semiconductor stacking structure to form a fourth semiconductor stacking structure.

19 Claims, 4 Drawing Sheets

MANUFACTURING METHOD OF SOLID STATE LIGHT EMITTING ELEMENT

This application claims the benefit of Taiwan application Ser. No. 100137803, filed Oct. 18, 2011, the subject matter of which is incorporated herein by reference.

BACKGROUND OF THE INVENTION

1. Field of the Invention

The invention relates in general to a light emitting element, and more particularly to a manufacturing method of a solid state light emitting element.

2. Description of the Related Art

The light-emitting diode (LED) emits a light by converting electric energy into photo energy. The LED is mainly composed of semiconductors. Of the semiconductors, those having a larger ratio of holes carrying positive electricity are referred as P type semiconductors, and those having a larger ratio of electrons carrying negative electricity are referred as N type semiconductors. The junction connecting a P type semiconductor and an N type semiconductor forms a PN junction. When a voltage is applied to the positive polarity and negative polarity of an LED chip, the electrons and the holes will be combined and emit energy in the form of a light.

In the manufacturing method of a light emitting diode formed by gallium nitride (GaN), sapphire is used as an epitaxy carrier, a buffer layer is formed on the sapphire substrate first, and then GaN is formed on the buffer layer. By doing so, the quality GaN epitaxial growth layer may thus be obtained. However, the sapphire substrate has poor performance in conductivity and heat-dissipation. To improve the heat-dissipation efficiency of the light emitting diode, the GaN epitaxial growth layer must be transferred to a substrate with better performance in conductivity and heat-dissipation. According to the conventional manufacturing method, the sapphire substrate disposed underneath the GaN epitaxy layer is removed by the excimer pulse laser beam process, that is, the generally used laser lift-off process. However, the laser lift-off process is highly complicated and the laser light may easily damage the GaN epitaxy. Therefore, how to improve the existing manufacturing process such that the GaN epitaxy may be separated from the sapphire substrate without causing any damage to the epitaxial growth layer has become a prominent task for the industries.

SUMMARY OF THE INVENTION

The invention is directed to a manufacturing method of a solid state light emitting element. The base layer disposed underneath the epitaxial growth layer is etched through the chemical reaction between an etchant solution and the object to be etched, such that the epitaxial growth layer may be separated from the substrate without causing any damage to the epitaxial growth layer.

According to one embodiment of the present invention, a manufacturing method of a solid state light emitting element is provided. The method includes the following steps. A first substrate is provided. A plurality of protrusion structures separated to each other is formed on a first substrate. A buffer layer is formed on the protrusion structures and fills the gaps between protrusion structures. An epitaxial growth layer constituted by a second type semiconductor epitaxial layer, an active layer and a first type semiconductor epitaxial layer in sequence is formed on the buffer layer to form a first semiconductor stacking structure. The first semiconductor stacking structure is inverted to a second substrate, so that the first semiconductor epitaxial layer and the second substrate are connected to form a second semiconductor stacking structure. A first etchant solution is used to process the second semiconductor stacking structure, so that the buffer layer is etched completely to form a third semiconductor stacking structure. A second etchant solution is used to process the third semiconductor stacking structure and permeate through the gaps between the protrusion structures located between the first substrate and the second semiconductor epitaxy layer, so that the protrusion structures are etched completely. The first substrate is removed from the third semiconductor stacking structure to form a fourth semiconductor stacking structure constituted by the second substrate and an epitaxial growth layer disposed thereon.

The above and other aspects of the invention will become better understood with regard to the following detailed description of the preferred but non-limiting embodiment(s). The following description is made with reference to the accompanying drawings.

DETAILED DESCRIPTION OF THE INVENTION

The manufacturing method of a solid state light emitting element of the present embodiment is related to a manufacturing method of a light emitting diode. According to the manufacturing method of the present embodiment, the protrusion structures and the buffer layer on a first substrate are used as a base layer disposed underneath the epitaxial growth layer so that a semiconductor epitaxial structure with light emitting property is formed. The protrusion structures are separated to each other and formed on the first substrate. The buffer layer is formed between the protrusion structures. After the semiconductor epitaxial structure are completed and inverted to the second substrate, the semiconductor epitaxial structure is sequentially processed with etchant solutions, so that the buffer layer and the protrusion structures are respectively etched completely. Then, the first substrate is removed, and the final semiconductor epitaxial structure is completed.

A number of embodiments are disclosed below for elaborating the invention. However, the embodiments of the invention are for detailed descriptions only, not for limiting the scope of protection of the invention.

FIGS. 1A~1H respectively are processes of a manufacturing method of a solid state light emitting element according to an embodiment of the disclosure.

Figure 1A:
FIGS. 1A~1H respectively are processes of a manufacturing method of a solid state light emitting element according to an embodiment of the disclosure.
Figure 1B:
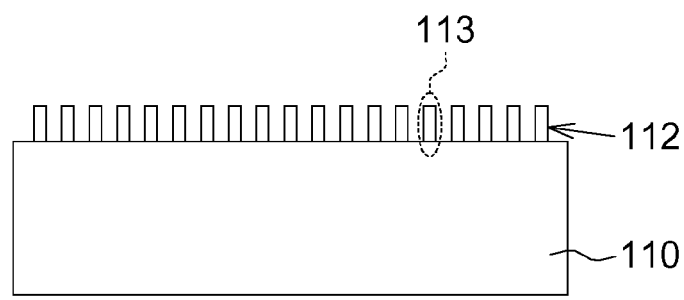
Figure 1C:
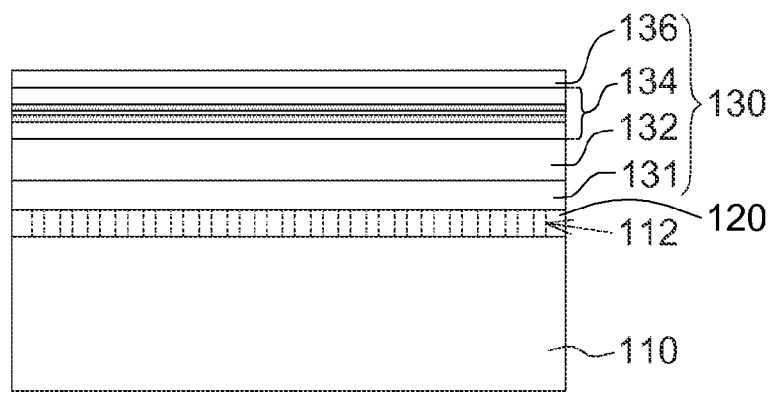

Referring to FIGS. 1A~1C. First, as shown in FIG. 1A, a first substrate 110 is formed. Next, as shown in FIG. 1B, a plurality of protrusion structures 112 separated to each other is formed on the first substrate 110. Then, as shown in FIG. 1C, a buffer layer 120 is formed on the protrusion structures 112 and fills the gaps between protrusion structures 112. Then, an epitaxial growth layer 130 constituted by the second type semiconductor epitaxial layer 132, an active layer 134 and a first type semiconductor epitaxial layer 136 in sequence is formed on the buffer layer 120 to form a first semiconductor stacking structure 100. As shown in FIG. 1C, before the second type semiconductor epitaxial layer 132 is formed, an nitride epitaxial layer 131 not doped with impurities is selectively formed on the buffer layer 120, and then the second type semiconductor epitaxial layer 132 is formed on the nitride epitaxial layer 131 not doped with impurities.

The first substrate 110 is such as a sapphire substrate. As shown in FIG. 1B, the protrusion structures 112 on the first substrate 110 are such as nano-pillar structures 113 formed by way of lithography and etching process. The nano-pillar structures 113 are metal oxides such as nickel oxide formed uniformly on the first substrate 110 by physical vapor deposition process or chemical vapor deposition process first, and then a part of the metal oxide is removed by way of wet etching or dry etching to form the nano-pillar structures 113.

In the present embodiment, nano-pillar structures 113 are periodically arranged on the first substrate 110. The height of the nano-pillar structures 113 ranges between 10~10,000 nano-meters (10 micro-meters) and preferably between 100~200 nano-meters. Besides, the distance between the apexes of two neighboring protrusion structures 112 ranges between 10~1,000 nano-meters and preferably between 50~100 nano-meters. The invention is not limited thereto.

As shown in FIG. 1C, the arrangement of the protrusion structures 112 makes the buffer layer 120 uniformly fill the gaps between the protrusion structures 112. The buffer layer 120 may be selected from a group constituted by nitrides such as gallium nitride (GaN), aluminum nitride (AlN) and aluminum gallium nitride (AlGaN). Besides, the epitaxial growth layer 130, constituted by nitrides contained the elements of group IIIA of the periodic table, includes the second type semiconductor epitaxial layer 132, an active layer 134 and a first type semiconductor epitaxial layer 136 in sequence. The epitaxial growth layer 130 is disposed on the buffer layer 120 and protrusion structures 112 to form a first semiconductor stacking structure 100. Elements of group IIIA includes boron, aluminum, gallium, indium, thallium and so on. In an embodiment, the first type semiconductor epitaxial layer 136 is a P-type semiconductor layer such as a P-type GaN, while the second type semiconductor epitaxial layer 132 is an N-type semiconductor layer such as an N-type GaN. In another embodiment, the first type semiconductor epitaxial layer 136 is an N-type semiconductor layer, while the second type semiconductor epitaxial layer 132 is a P-type semiconductor layer. The active layer 134 includes multiple quantum well layers. Thus, when a voltage is applied to the first type semiconductor epitaxial layer 136 and the second type semiconductor epitaxial layer 132 which have different electric properties, the electrons and the holes in the active layer 134 will be combined together and emit energy in the form of a light.

As shown in FIG. 1C, the nitride epitaxial layer 131 not doped with impurities are located between the buffer layer 120 and the second type semiconductor epitaxial layer 132 and are constituted by nitrides contained the elements of group IIIA of the periodic table, such as AlN, GaN or InGaN.

The buffer layer 120 may be formed by way of chemical vapor deposition (CVD) process or physical vapor deposition (PVD) process. Examples of chemical vapor deposition process include hot filament chemical vapor deposition process and microwave plasma enhanced chemical vapor deposition process. Examples of physical vapor deposition process include ion beam sputtering process and evaporation process. Also, the epitaxial growth layer 130 may be formed by way of metal-organic chemical vapor deposition (MOCVD) process, molecular beam epitaxy (MBE) process, liquid phase epitaxy method (LPE) process or vapor phase epitaxy (VPE) process.

Figure 1D:
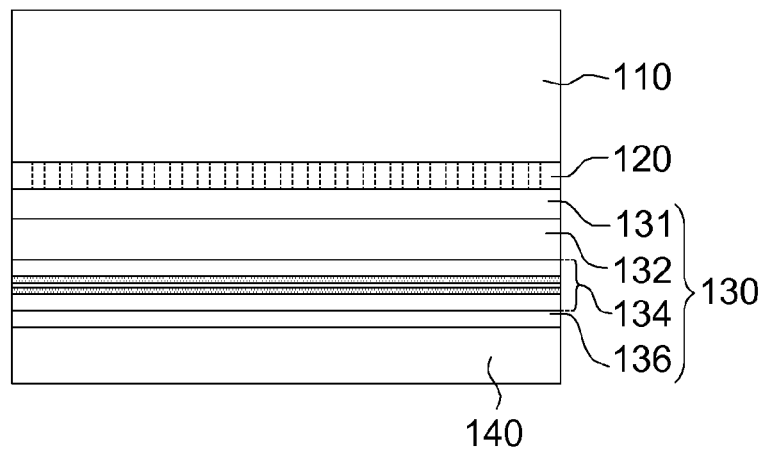
Figure 1E:
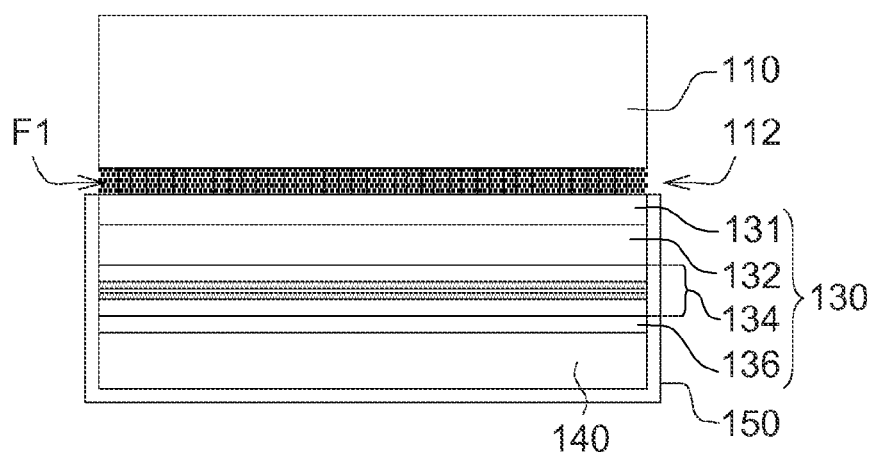
Figure 1F:
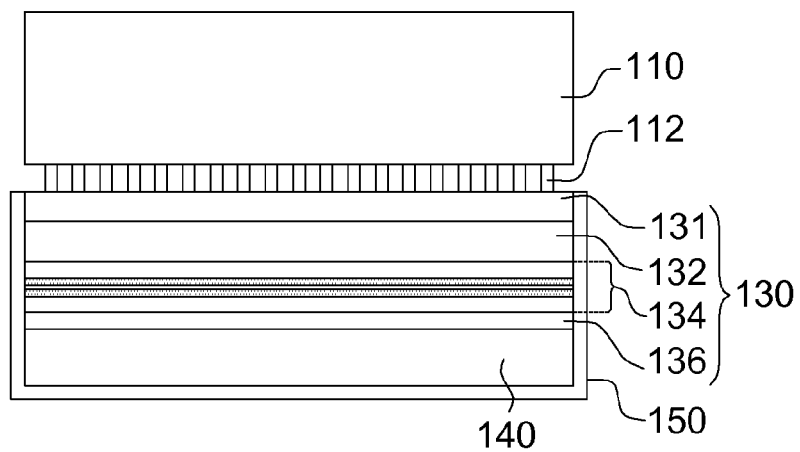
Figure 1G:
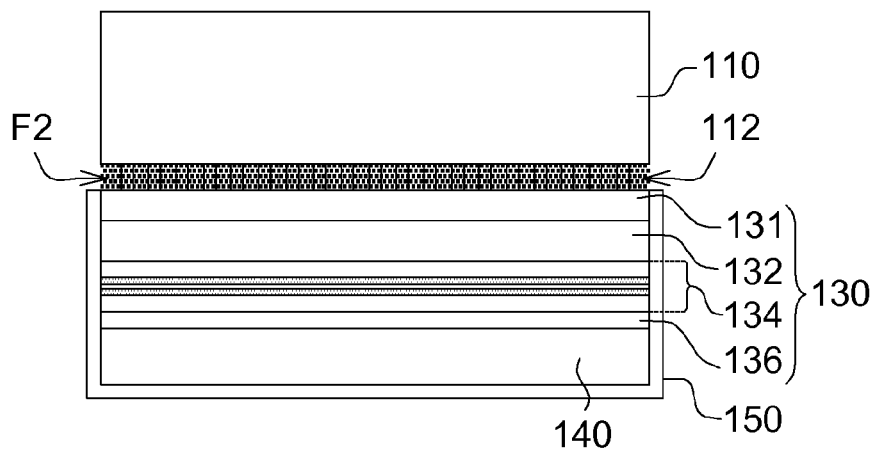

Referring to FIGS. 1D~1G. As shown in FIG. 1D, the first semiconductor stacking structure 100 is inverted to a second substrate 140, so that the first type semiconductor epitaxial layer 136 and the second substrate 140 are connected to form a second semiconductor stacking structure 101. As shown in FIG. 1E, a first etchant solution F1 is used for processing the second semiconductor stacking structure 101, so that the buffer layer 120 is etched completely and only the protrusion structures 112 will be left to form a third semiconductor stacking structure 102 as shown in FIG. 1F. As shown in FIG. 1G, a second etchant solution F2 is used for processing the third semiconductor stacking structure 102, so that the second etchant solution F2 permeates through the gaps of the protrusion structures 112 between the first substrate 110 and the second type semiconductor epitaxial layer 132 to etch the protrusion structures 112 completely.

The second substrate 140 is a conductive substrate which may be realized by a silicon substrate or a copper substrate. As shown in FIG. 1D, the first substrate 110 using sapphire as the base material has poor performance in conductivity and heat-dissipation, the first semiconductor stacking structure 100 is inverted to the second substrate 140 with better conductivity and heat-dissipation lest the light emitting efficiency of the solid state light emitting element might deteriorate due to high temperature.

As shown in FIG. 1E, the first etchant solution F1 is an alkaline etchant solution used for etching the buffer layer 120. The buffer layer 120 is a nitride soluble in the alkaline etchant solution. The alkaline etchant solution includes potassium hydroxide (KOH), sodium hydroxide (NaOH) or a combination thereof. As shown in FIG. 1E, before using the first etchant solution F1 to etch the buffer layer 120, the method further includes forming a protection layer 150 to cover the surfaces of the epitaxial growth layer 130 and the second substrate 140. The protection layer 150, such as an anti-acid/alkali-base macromolecular photoresist material or an inorganic material, is formed by epoxy resin, silicon nitride or silicon oxide nitride.

As shown in FIG. 1F, since the first etchant solution F1 does not etch the protrusion structures 112, the protrusion structures 112 will remain in the third semiconductor stacking structure 102 and will not be etched, and only the gaps between the protrusion structures 112 originally filled by the buffer layer 120 will be exposed.

As shown in FIG. 1G, the second etchant solution F2 is an acid etchant solution used for etching the protrusion structures 112. The protrusion structures 112 are metal oxides soluble in the acid etchant solution. The acid etchant solution includes nitric acid ($HNO_3$), acetic acid ($CH_3COOH$), hydrochloric acid (HCl) or hydrofluoric acid (HF) or a combination thereof. The second etchant solution F2 flows to the gaps between the protrusion structures 112 by capillarity to etch the protrusion structures 112. The solid state light emitting element of the present embodiment can selectively form a nitride epitaxial layer 131 not doped with impurities. In the present embodiment, the protrusion structures 112 are located between the substrate 110 and the nitride epitaxial layer 131 not doped with impurities. After the protrusion structures 112 are etched by the second etchant solution F2, the bonding strength between the first substrate 110 and the nitride epitaxial layer 131 not doped with impurities deteriorates, making the substrate 110 separable from the nitride epitaxial layer 131 not doped with impurities. If the solid state light emitting element does not have the nitride epitaxial layer 131 not doped with impurities, the protrusion structures 112 are located between the substrate 110 and the second type semiconductor epitaxial layer 132. Thus, after the protrusion structures 112 are etched by the second etchant solution F2, the bonding strength between the first substrate 110 and the second type semiconductor epitaxial layer 132 deteriorates, making the substrate 110 separable from the second type semiconductor epitaxial layer 132.

Figure 1H:
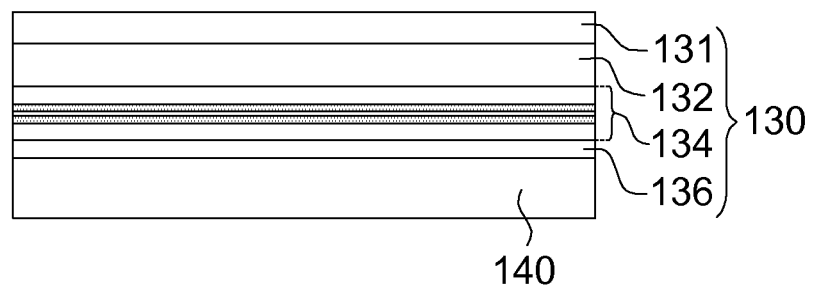

As shown in FIG. 1H, the first substrate 110 is removed from the third semiconductor stacking structure 102 to form a fourth semiconductor stacking structure 103 including the second substrate 140 and an epitaxial growth layer 130 disposed thereon. As shown in FIG. 1G, after the first substrate 110 is removed, the protection layer 150 is also removed. The protection layer 150 may be removed by way of dry etching or wet etching.

According to the manufacturing method of a solid state light emitting element disclosed in the above embodiments of the disclosure, the protrusion structures and the buffer layer are used as a base layer disposed underneath the epitaxial growth layer. The protrusion structures are separated to each other and formed on the first substrate. The etchant solutions sequentially etch the buffer layer and protrusion structures, such that the epitaxial growth layer may be separated from the first substrate without causing any damage to the epitaxial growth layer. Thus, quality solid state light emitting element is obtained and product reliability is increased.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a solid state light emitting element, the method comprising:
   providing a first substrate;
   forming a plurality of protrusion structures separated to each other on the first substrate;
   forming a buffer layer on the protrusion structures, wherein the buffer layer fills the gaps between the protrusion structures;
   forming an epitaxial growth layer on the buffer layer to form a first semiconductor stacking structure, wherein the epitaxial growth layer is constituted by a second type semiconductor epitaxial layer, an active layer and a first type semiconductor epitaxial layer in sequence;
   inverting the first semiconductor stacking structure to a second substrate, so that the first semiconductor epitaxial layer and the second substrate are connected to form a second semiconductor stacking structure;
   processing the second semiconductor stacking structure by a first etchant solution, which etches the buffer layer completely to form a third semiconductor stacking structure;
   processing the third semiconductor stacking structure by a second etchant solution, which permeates through the gaps between the protrusion structures located between the first substrate and the second type semiconductor epitaxial layer to etch the protrusion structures completely, wherein the second etchant solution used for etching the protrusion structures is an acid etchant solution; and
   removing the first substrate from the third semiconductor stacking structure to form a fourth semiconductor stacking structure constituted by the second substrate and the epitaxial growth layer disposed thereon.

2. A manufacturing method of a solid state light emitting element, the method comprising:
   providing a first substrate;
   forming a plurality of protrusion structures separated to each other on the first substrate;
   forming a buffer layer on the protrusion structures, wherein the buffer layer fills the gaps between the protrusion structures;
   forming an epitaxial growth layer on the buffer layer to form a first semiconductor stacking structure, wherein the epitaxial growth layer is constituted by a second type semiconductor epitaxial layer, an active layer and a first type semiconductor epitaxial layer in sequence;
   inverting the first semiconductor stacking structure to a second substrate, so that the first semiconductor epitaxial layer and the second substrate are connected to form a second semiconductor stacking structure;
   processing the second semiconductor stacking structure by a first etchant solution, which etches the buffer layer completely to form a third semiconductor stacking structure;
   processing the third semiconductor stacking structure by a second etchant solution, which permeates through the gaps between the protrusion structures located between the first substrate and the second type semiconductor epitaxial layer to etch the protrusion structures completely; and
   removing the first substrate from the third semiconductor stacking structure to form a fourth semiconductor stacking structure constituted by the second substrate and the epitaxial growth layer disposed thereon, wherein before using the first etchant solution for etching the buffer layer, the method further comprises forming a protection layer covering the surfaces of the epitaxial growth layer and the second substrate.

3. The method according to claim 2, wherein after removing the first substrate, the method further comprises removing the protection layer.

4. The method according to claim 2, wherein the protection layer is formed by an anti-acid/alkali-base macromolecular photoresist material or an inorganic material.

5. The method according to claim 1, wherein the forming method of the protrusion structures comprises lithography and etching.

6. A manufacturing method of a solid state light emitting element, the method comprising:
   providing a first substrate;
   forming a plurality of protrusion structures separated to each other on the first substrate;
   forming a buffer layer on the protrusion structures, wherein the buffer layer fills the gaps between the protrusion structures;
   forming an epitaxial growth layer on the buffer layer to form a first semiconductor stacking structure, wherein the epitaxial growth layer is constituted by a second type semiconductor epitaxial layer, an active layer and a first type semiconductor epitaxial layer in sequence;
   inverting the first semiconductor stacking structure to a second substrate, so that the first semiconductor epitaxial layer and the second substrate are connected to form a second semiconductor stacking structure;
   processing the second semiconductor stacking structure by a first etchant solution, which etches the buffer layer completely to form a third semiconductor stacking structure;
   processing the third semiconductor stacking structure by a second etchant solution, which permeates through the gaps between the protrusion structures located between the first substrate and the second type semiconductor epitaxial layer to etch the protrusion structures completely; and removing the first substrate from the third semiconductor stacking structure to form a fourth semiconductor stacking structure constituted by the second substrate and the epitaxial growth layer disposed thereon, wherein the protrusion structures are nano-pillar structures formed by metal oxides, and the height of each nano-pillar structure ranges between 10~10,000 nano-meters.

7. The method according to claim 6, wherein the metal oxides comprises nickel oxide.

8. The method according to claim 1, wherein the distance between apexes of two neighboring protrusion structures ranges between 10~1,000 nano-meters.

9. The method according to claim 1, wherein the first etchant solution used for etching the buffer layer is an alkaline etchant solution.

10. The method according to claim 9, wherein the alkaline etchant solution comprises potassium hydroxide (KOH) or sodium hydroxide (NaOH).

11. The method according to claim 1, wherein the acid etchant solution comprises nitric acid ($HNO_3$), acetic acid, hydrochloric acid or hydrofluoric acid (HF) or a combination thereof.

12. The method according to claim 1, wherein the second substrate is a conductive substrate.

13. The method according to claim 1, wherein the buffer layer is formed by nitrides.

14. The method according to claim 13, wherein the buffer layer is selected by a group composed of gallium nitride (GaN), aluminum nitride (AlN) and aluminum gallium nitride (AlGaN).

15. The method according to claim 1, wherein the epitaxial growth layer is formed by nitrides contained the elements of group IIIA of the periodic table.

16. The method according to claim 1, wherein the first type semiconductor epitaxial layer is a P-type semiconductor layer, and the second type semiconductor epitaxial layer is an N-type semiconductor layer.

17. The method according to claim 1, wherein the first type semiconductor epitaxial layer is an N-type semiconductor layer, and the second type semiconductor epitaxial layer is a P-type semiconductor layer.

18. The method according to claim 1, wherein the active layer comprises a plurality of quantum well layers.

19. The method according to claim 1, further comprising forming an nitride epitaxial layer not doped with impurities between the buffer layer and the second type semiconductor epitaxial layer, wherein the nitride epitaxial layer not doped with impurities is formed by nitrides contained the elements of group IIIA of the periodic table.

* * * * *